United States Patent
Kim et al.

(10) Patent No.: US 12,211,795 B2
(45) Date of Patent: Jan. 28, 2025

(54) SEMICONDUCTOR DEVICE

(71) Applicant: SAMSUNG ELECTRONICS CO., LTD., Suwon-si (KR)

(72) Inventors: Jinsub Kim, Seoul (KR); Kyoung-Hee Kim, Hwaseong-si (KR); Munjun Kim, Suwon-si (KR); Jun Kwan Kim, Seoul (KR); Woo Choel Noh, Hwaseong-si (KR)

(73) Assignee: SAMSUNG ELECTRONICS CO., LTD., Suwon-si (KR)

( * ) Notice: Subject to any disclaimer, the term of this patent is extended or adjusted under 35 U.S.C. 154(b) by 639 days.

(21) Appl. No.: 17/509,636

(22) Filed: Oct. 25, 2021

(65) Prior Publication Data

US 2022/0344276 A1  Oct. 27, 2022

(30) Foreign Application Priority Data

Apr. 22, 2021  (KR) .................. 10-2021-0052319

(51) Int. Cl.
*H01L 23/532* (2006.01)
*H01L 21/768* (2006.01)
(Continued)

(52) U.S. Cl.
CPC .. *H01L 23/53295* (2013.01); *H01L 21/76831* (2013.01); *H01L 23/5226* (2013.01);
(Continued)

(58) Field of Classification Search
CPC .......... H01L 23/5226; H01L 23/53295; H01L 21/76849; H01L 21/76831; H10B 43/27;
(Continued)

(56) References Cited

U.S. PATENT DOCUMENTS 8,648,441 B2  2/2014  Hijioka et al.
8,841,195 B2  9/2014  Sun et al.
(Continued)

FOREIGN PATENT DOCUMENTS

CN  101299429 A  11/2008
CN  102254916 A  11/2011
CN  109817620 A  5/2019

*Primary Examiner* — Jaehwan Oh
*Assistant Examiner* — John M Parker
(74) *Attorney, Agent, or Firm* — MORGAN, LEWIS & BOCKIUS LLP

(57) ABSTRACT

A semiconductor device includes a substrate including a cell array region and a peripheral circuit region, capacitors on the cell array region of the substrate, peripheral transistors on the peripheral circuit region of the substrate, a first upper interlayer insulating layer on the capacitors and the peripheral transistors, a first upper contact electrically connected to at least one of the peripheral transistors, the first upper contact penetrating the first upper interlayer insulating layer, a first upper interconnection line provided on the first upper interlayer insulating layer and electrically connected to the first upper contact, a second upper interlayer insulating layer covering the first upper interconnection line, and a first blocking layer between the first upper interlayer insulating layer and the second upper interlayer insulating layer. The first blocking layer is absent between the first upper interconnection line and the first upper interlayer insulating layer.

20 Claims, 12 Drawing Sheets

(51) Int. Cl.
    *H01L 23/522* (2006.01)
    *H10B 12/00* (2023.01)
(52) U.S. Cl.
    CPC ........ *H10B 12/50* (2023.02); *H01L 21/76885* (2013.01); *H10B 12/315* (2023.02)
(58) Field of Classification Search
    CPC ...... H10B 12/50; H10B 12/315; H10B 12/09; H10B 41/27
    See application file for complete search history.

(56) References Cited

U.S. PATENT DOCUMENTS

| | | |
|---|---|---|
| 8,897,907 B2 | 11/2014 | Ikeba |
| 9,991,126 B2 | 6/2018 | Park et al. |
| 10,032,780 B2 | 7/2018 | Cho et al. |
| 10,566,284 B2 | 2/2020 | Kim et al. |
| 2010/0224922 A1 | 9/2010 | Shinhara |
| 2013/0147022 A1 | 6/2013 | Yoon et al. |
| 2015/0206893 A1* | 7/2015 | Sun ..................... H10B 53/30 257/532 |
| 2019/0157214 A1* | 5/2019 | Kim ................... H01L 21/7682 |
| 2020/0035613 A1 | 1/2020 | Kim et al. |
| 2020/0066512 A1 | 2/2020 | Tois et al. |
| 2020/0354834 A1 | 11/2020 | De Silva et al. |
| 2020/0381469 A1* | 12/2020 | Kanesada ......... H01L 27/14636 |

\* cited by examiner

SEMICONDUCTOR DEVICE

CROSS-REFERENCE TO RELATED APPLICATION

This U.S. non-provisional patent application claims priority under 35 U.S.C. § 119 to Korean Patent Application No. 10-2021-0052319, filed on Apr. 22, 2021, in the Korean Intellectual Property Office, the disclosure of which is hereby incorporated by reference in its entirety.

BACKGROUND

Embodiments of the inventive concepts relate to a semiconductor device and, more particularly, to a semiconductor device capable of selectively blocking a supply of hydrogen.

Semiconductor devices are widely used in the electronic industry because of their small size, multi-functional characteristics, and low manufacturing costs. Semiconductor devices however, are currently highly integrated as a result of the evolution of the electronic industry. Semiconductor devices may be categorized as any one of semiconductor memory devices for storing logical data, semiconductor logic devices for processing logical data, and hybrid semiconductor devices having both, the functions of the semiconductor memory devices and those of semiconductor logic devices. In addition, semiconductor devices having excellent performance characteristics, have increasing demand. For example, highly-reliable, high-speed and multi-functional semiconductor devices have been seen increasing demand. To satisfy these demands, semiconductor devices have been increasingly integrated and structures in semiconductor devices have become more and more complex.

SUMMARY

Embodiments of the inventive concepts provide a semiconductor device with improved electrical characteristics and higher reliability.

In an aspect, a semiconductor device may include a substrate including a cell array region and a peripheral circuit region, capacitors provided on the cell array region of the substrate, peripheral transistors provided on the peripheral circuit region of the substrate, a first upper interlayer insulating layer provided over the capacitors and the peripheral transistors, a first upper contact electrically connected to at least one of the peripheral transistors, the first upper contact penetrating the first upper interlayer insulating layer, a first upper interconnection line provided on the first upper interlayer insulating layer and electrically connected to the first upper contact, a second upper interlayer insulating layer covering the first upper interconnection line, and a first blocking layer disposed between the first upper interlayer insulating layer and the second upper interlayer insulating layer. The first blocking layer may not be disposed between the first upper interconnection line and the first upper interlayer insulating layer.

In an aspect, a semiconductor device may include a substrate including a cell array region and a peripheral circuit region, capacitors provided over the cell array region of the substrate, peripheral transistors provided on the peripheral circuit region of the substrate, a first lower interconnection line connected to at least one of the peripheral transistors, a second lower interconnection line connected to the capacitors, an interface layer covering the first and second lower interconnection lines, a first upper interlayer insulating layer and a second upper interlayer insulating layer which are sequentially stacked on the interface layer, a first upper contact and a second upper contact which penetrate the first upper interlayer insulating layer and the interface layer so as to be electrically connected to the first and second lower interconnection lines, respectively, a first upper interconnection line and a second upper interconnection line which are electrically connected to the first and second upper contacts, respectively, the second upper interlayer insulating layer covering the first and second upper interconnection lines, and a first blocking layer disposed between the first upper interlayer insulating layer and the second upper interlayer insulating layer. The first blocking layer may be spaced apart from the first upper contact.

In an aspect, a semiconductor device may include a substrate including a cell array region and a peripheral circuit region; capacitors provided over the cell array region of the substrate, wherein each of the capacitors comprises a bottom electrode, a top electrode, and a dielectric layer between the bottom electrode and the top electrode; peripheral transistors provided on the peripheral circuit region of the substrate; a low-k dielectric layer provided over the capacitors and the peripheral transistors; a first lower interconnection line electrically connected to at least one of the peripheral transistors, and a second lower interconnection line electrically connected to the capacitors, the first and second lower interconnection lines penetrating the low-k dielectric layer; an interface layer covering the first and second lower interconnection lines; a first upper interlayer insulating layer provided on the interface layer; a second upper interlayer insulating layer provided on the first upper interlayer insulating layer; a blocking layer disposed between the first upper interlayer insulating layer and the second upper interlayer insulating layer; a first upper contact and a second upper contact which penetrates the first upper interlayer insulating layer and the interface layer so as to be connected to the first and second lower interconnection lines, respectively; a first upper interconnection line and a second upper interconnection line which are electrically connected to the first upper contact and the second upper contact, respectively, the second upper interlayer insulating layer covering the first and second upper interconnection lines; and a passivation layer on the second upper interlayer insulating layer. The blocking layer may be absent between the first upper interconnection line and the first upper interlayer insulating layer and between the second upper interconnection line and the first upper interlayer insulating layer.

BRIEF DESCRIPTION OF THE DRAWINGS

The inventive concepts will become better understood in view of the attached drawings and accompanying detailed description.

DETAILED DESCRIPTION OF THE EMBODIMENTS

Figure 1:
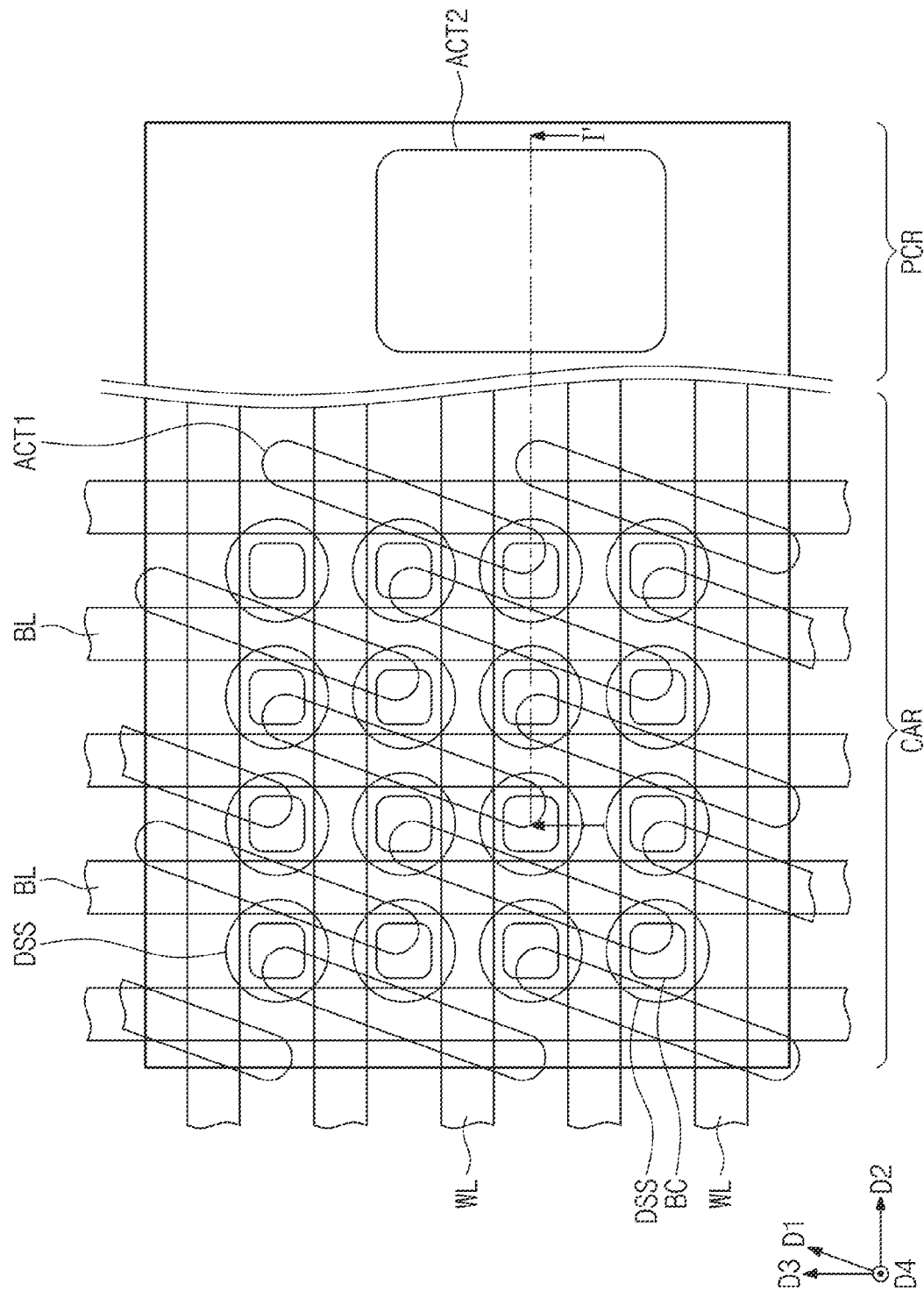
FIG. 1 is a plan view illustrating a semiconductor device according to some embodiments of the inventive concepts.
Figure 2:
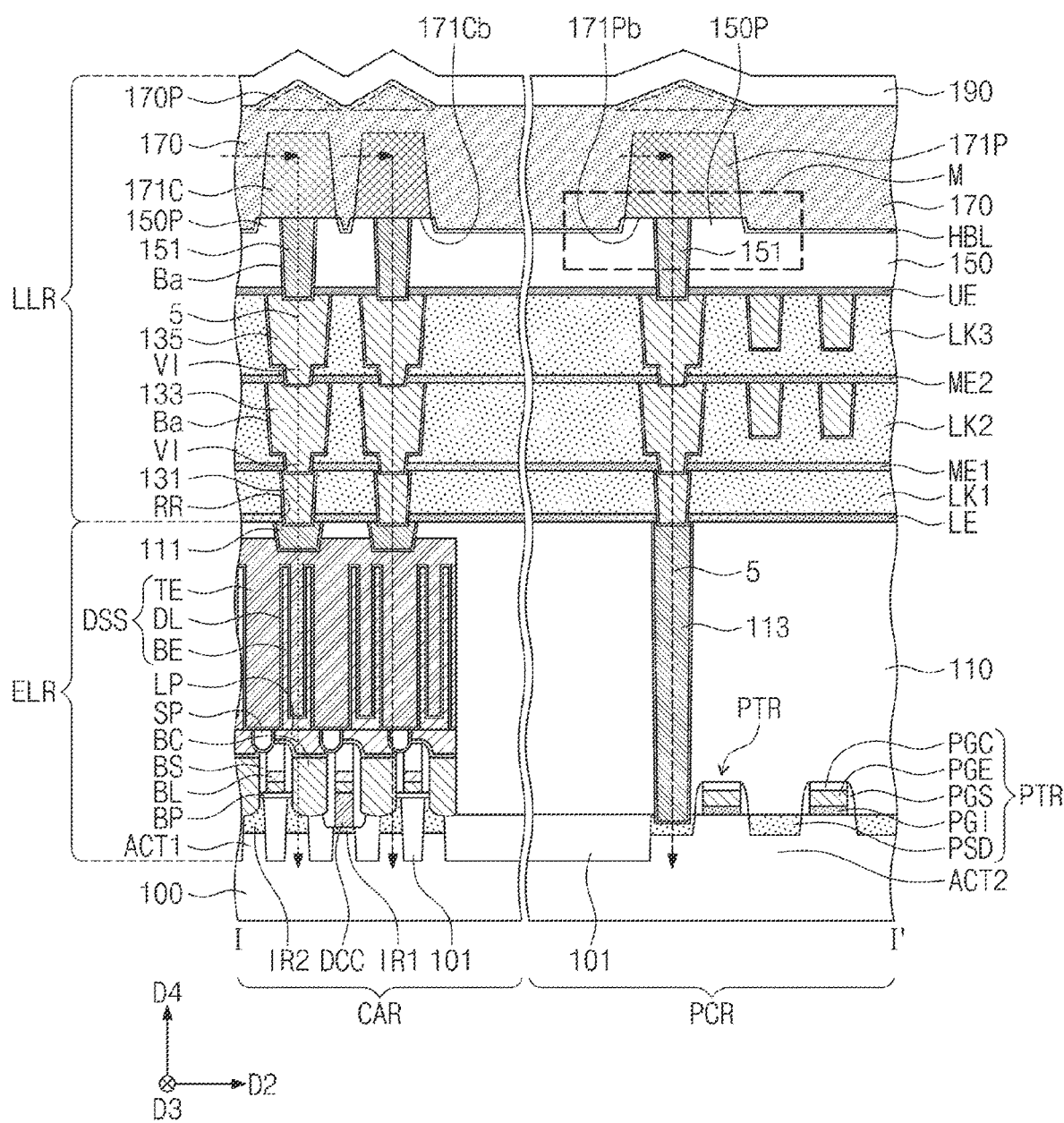
FIG. 2 is a cross-sectional view taken along a line I-I' of FIG. 1 to illustrate a semiconductor device according to some embodiments of the inventive concept.
Figure 3:
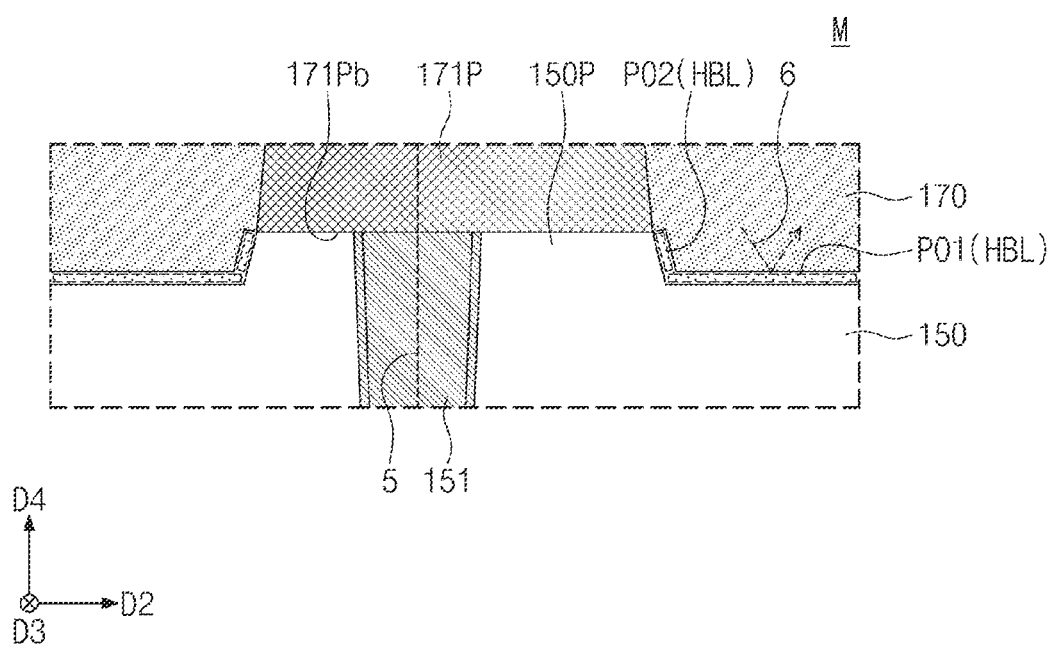
FIG. 3 is an enlarged view of a region 'M' of FIG. 2.

FIG. 1 is a plan view illustrating a semiconductor device according to some embodiments of the inventive concept. FIG. 2 is a cross-sectional view taken along a line I-I' of FIG. 1 to illustrate a semiconductor device according to some embodiments of the inventive concept. FIG. 3 is an enlarged view of a region 'M' of FIG. 2.

Referring to FIGS. 1 and 2, a semiconductor device may include an integrated circuit region ELR on a substrate 100, and an interconnection region LLR on the integrated circuit region ELR. The integrated circuit region ELR may include a plurality of transistors and/or circuits on the substrate 100. The interconnection region LLR may include a plurality of interconnection lines connected to the plurality of transistors and/or circuits.

When the semiconductor device according to the inventive concepts is a memory device, the integrated circuit region ELR may include a cell array of a cell array region CAR, and peripheral circuits of a peripheral circuit region PCR for driving the cell array. The cell array may include cell transistors, and the peripheral circuits may include peripheral transistors PTR. For example, the peripheral circuit region PCR may surround the cell array region CAR when viewed in a plan view.

The cell array region CAR may be a region on which memory cells are disposed. The peripheral circuit region PCR may be a region on which a word line driver, a sense amplifier, row and column decoders and control circuits are disposed. Alternatively, when the semiconductor device according to the inventive concept is a non-memory device, the integrated circuit region ELR may omit the cell array of the cell array region CAR. Hereinafter, the embodiments in which the semiconductor device is a memory device will be described as examples. However, embodiments of the inventive concept are not limited thereto.

The integrated circuit region ELR on the cell array region CAR may include first active regions ACT1 defined by a device isolation layer 101 formed in an upper portion of the substrate 100, the cell transistors on the first active regions ACT1, and a data storage structure DSS connected to the cell transistors.

For example, the substrate 100 may be a semiconductor substrate including silicon, germanium, or silicon-germanium. The first active regions ACT1 provided in the upper portion of the substrate 100 may have bar shapes horizontally separated from each other and may extend in a first direction D1 parallel to a top surface of the substrate 100. The first direction D1 may be non-perpendicular to both a second direction D2 and a third direction D3 which are parallel to the top surface of the substrate 100.

A pair of word lines WL may be provided at each of the first active regions ACT1. The word lines WL may be buried in the upper portion of the substrate 100 and may extend in the second direction D2 to intersect the first active regions ACT1. The word lines WL may be spaced apart from each other in the third direction D3.

First dopant regions IR1 and second dopant regions IR2 may be provided in the first active regions ACT1. The first dopant regions IR1 and the second dopant regions IR2 may have a different conductivity type compared to that of the substrate 100. The first dopant region IR1 may be disposed in each of the first active regions ACT1 between the pair of word lines WL, and the second dopant regions IR2 may be disposed in both edges of each of the first active regions ACT1, respectively. The first dopant region IR1 may be disposed at a side of one word line WL, and the second dopant region IR2 may be disposed at another side of the one word line WL. The one word line WL may correspond to a gate electrode of the cell transistor, and the first and second dopant regions IR1 and IR2 disposed at both sides thereof may correspond to source/drain regions of the cell transistor, respectively.

A buffer pattern BP may be provided on the top surface of the substrate 100. The buffer pattern BP may include a single layer or multi-layer formed of insulating material. Bit line contacts DCC may be provided on the first active regions ACT1. The bit line contacts DCC may penetrate the buffer pattern BP and may extend in a fourth direction D4 perpendicular to the top surface of the substrate 100. The bit line contacts DCC may be connected to the first dopant regions IR1, respectively.

Bit lines BL may be provided to intersect the word lines WL. The bit lines BL may extend in the third direction D3. The bit lines BL may be spaced apart from each other in the second direction D2. The bit lines BL may intersect the first active regions ACT1. The bit lines BL may be in contact with the buffer pattern BP and the bit line contacts DCC. Each of the bit lines BL may include a first conductive pattern, a second conductive pattern and a capping pattern, which are sequentially stacked. Spacers BS may be provided to cover sidewalls of the first and second conductive patterns and the capping pattern. Node contacts BC connected to the data storage structure DSS may be provided between the bit lines BL adjacent to each other. The node contacts BC may be connected to the second dopant regions IR2, respectively.

Landing pads LP may be provided on the node contacts BC. The landing pads LP may be separated from each other by a separation pattern SP. The data storage structure DSS may be provided on the landing pads LP. For example, the data storage structure DSS may include capacitors. The data storage structure DSS may include bottom electrodes BE, a top electrode TE, and a dielectric layer DL between the top electrode TE and the bottom electrodes BE. Unlike FIG. 2, the data storage structure DSS may further include support patterns supporting sidewalls of the bottom electrodes BE.

For example, the bottom electrode BE of the data storage structure DSS may have a pillar shape or a cylindrical shape having a closed bottom end. For example, the bottom electrode BE may include at least one of poly-silicon with dopants, a metal, a metal nitride, a metal silicide, or a poly-silicide. The dielectric layer DL may conformally cover the bottom electrodes BE. For example, the dielectric layer DL may include an oxide, a nitride, a silicide, an oxynitride or a silicic oxynitride, which includes at least one of hafnium (Hf), aluminum (Al), zirconium (Zr), or lanthanum (La). The top electrode TE may cover the dielectric layer DL. For example, when the bottom electrode BE has the cylindrical shape having a closed bottom end, the top electrode TE may fill the inside of the cylindrical shape. The top electrode TE may include, for example, silicon-germanium with dopants.

In the above embodiments, the structure of the integrated circuit region ELR on the cell array region CAR includes a cell array of a dynamic random access memory (DRAM) device. However, embodiments of the inventive concept are not limited thereto. In certain embodiments, the semiconductor device according to the inventive concept may be a memory device including a variable resistor such as a phase change material.

The integrated circuit region ELR on the peripheral circuit region PCR may include a second active region ACT2 defined by the device isolation layer 101, and the peripheral transistors PTR provided on the second active region ACT2. Each of the peripheral transistors PTR may include a peripheral gate insulating layer PGI, a peripheral gate electrode PGE and a peripheral gate capping layer PGC, which are sequentially stacked on the second active region ACT2. Each of the peripheral transistors PTR may further include peripheral gate spacers PGS covering sidewalls of the peripheral gate insulating layer PGI, the peripheral gate electrode PGE and the peripheral gate capping layer PGC, and source/drain regions PSD provided at both sides of the peripheral gate electrode PGE.

A lower interlayer insulating layer 110 may be provided to cover the peripheral transistors PTR on the peripheral circuit region PCR and the data storage structure DSS on the cell array region CAR. For example, the lower interlayer insulating layer 110 may include boro-phosphosilicate glass (BPSG), tonen sazene (TOSZ), undoped silicate glass (USG), spin-on glass (SOG), a flowable oxide (FOX), tetraethyl orthosilicate (TEOS), a high density plasma chemical vapor deposition (HDP CVD) dielectric, and/or hydrogen silsesquioxane (HSQ).

The interconnection region LLR on the integrated circuit region ELR may include interlayer insulating layers, low-k dielectric layers, and interconnection lines formed therein. For example, the interconnection region LLR may include first to third low-k dielectric layers LK1, LK2 and LK3 sequentially stacked, and first and second upper interlayer insulating layers 150 and 170 sequentially stacked on the third low-k dielectric layer LK3. A first lower interconnection line 131, a second lower interconnection line 133 and a third lower interconnection line 135 may be provided in the first low-k dielectric layer LK1, the second low-k dielectric layer LK2 and the third low-k dielectric layer LK3, respectively. However, the number of the low-k dielectric layers and the number of the lower interconnection lines are not limited thereto but may be of different kinds and numbers.

In the present disclosure, the low-k dielectric layer may mean an insulating layer having a dielectric constant lower than 4.4. For example, the first to third low-k dielectric layers LK1, LK2 and LK3 may include SiOCH. For example, the first to third lower interconnection lines 131, 133 and 135 may include copper (Cu) or tungsten (W). In some embodiments, each of the second and third lower interconnection lines 133 and 135 may include a via VI provided on a bottom surface of a line-type structure extending in one direction. An upper width of each of the first to third lower interconnection lines 131, 133 and 135 may be greater than a lower width thereof. However, embodiments of the inventive concept are not limited thereto. In the present disclosure, the 'width' may mean a width in the second direction D2 (or the third direction D3) parallel to the top surface of the substrate 100.

Thicknesses of the first to third low-k dielectric layers LK1, LK2 and LK3 may be different from each other. For example, the thickness of the first low-k dielectric layer LK1 may be less than the thicknesses of the second and third low-k dielectric layers LK2 and LK3. In the present disclosure, the 'thickness' may mean a thickness in the fourth direction D4 perpendicular to the top surface of the substrate 100. The first to third low-k dielectric layers LK1, LK2 and LK3 may be of the same material. However, embodiments of the inventive concept are not limited thereto. In certain embodiments, at least one of the first to third low-k dielectric layers LK1, LK2 and LK3 may be made of a material of which a dielectric constant or composition is different from that of other(s) of the first to third low-k dielectric layers LK1, LK2 and LK3.

One of the first lower interconnection lines 131, which is provided on the cell array region CAR, may be connected to an upper portion of the data storage structure DSS (e.g., the top electrode TE of the capacitors) through a first lower contact 111. Another of the first lower interconnection lines 131, which is provided on the peripheral circuit region PCR, may be connected to one of the source/drain regions PSD of the peripheral transistors PTR through a second lower contact 113. A bottom surface of the second lower contact 113 may be located at a lower level than a bottom surface of the first lower contact 111. Top surfaces of the first and second lower contacts 111 and 113 may be located at substantially the same level. The first and second lower contacts 111 and 113 may include at least one of tungsten (W), titanium (Ti), tantalum (Ta), or any nitride thereof.

A lower interface layer LE may be provided between the first low-k dielectric layer LK1 and the lower interlayer insulating layer 110. An upper interface layer UE may be provided between the third low-k dielectric layer LK3 and the first upper interlayer insulating layer 150. For example, the lower interface layer LE may be an interface layer being in contact with a lowermost one of the first to third low-k dielectric layers LK1, LK2 and LK3, and the upper interface layer UE may be an interface layer being in contact with an uppermost one of the first to third low-k dielectric layers LK1, LK2 and LK3. First and second intermediate interface layers ME1 and ME2 may be provided between the first to third low-k dielectric layers LK1, LK2 and LK3. For example, the first intermediate interface layer ME1 may be provided between the first low-k dielectric layer LK1 and the second low-k dielectric layer LK2, and the second intermediate interface layer ME2 may be provided between the second low-k dielectric layer LK2 and the third low-k dielectric layer LK3. At least one of the lower interface layer LE, the upper interface layer UE and the first and second intermediate interface layers ME1 and ME2 may include a plurality of insulating layers having different properties. For example, the upper interface layer UE may include a plurality of interface layers. Alternatively, the lower interface layer LE, the upper interface layer UE and the first and second intermediate interface layers ME1 and ME2 may be single layers. Each of the lower interface layer LE, the upper interface layer UE and the first and second intermediate interface layers ME1 and ME2 may include, for example, silicon nitride (SiN) or silicon carbonitride (SiCN). For example, the upper interface layer UE may include silicon nitride (SiN), and the lower interface layer LE and the first and second intermediate interface layers ME1 and ME2 may include silicon carbonitride (SiCN).

The first and second upper interlayer insulating layers 150 and 170 may be provided on the third low-k dielectric layer LK3. Dielectric constants of the first and second upper interlayer insulating layers 150 and 170 may be higher than those of the first to third low-k dielectric layers LK1, LK2 and LK3. For example, the dielectric constant of each of the first and second upper interlayer insulating layers 150 and 170 may be 4.4 or more. For example, each of the first and second upper interlayer insulating layers 150 and 170 may include boro-phosphosilicate glass (BPSG), tonen sazene (TOSZ), undoped silicate glass (USG), spin-on glass (SOG), a flowable oxide (FOX), tetraethyl orthosilicate (TEOS), a high density plasma (HDP) CVD dielectric, or hydrogen silsesquioxane (HSQ).

An upper contact 151 may be provided in the first upper interlayer insulating layer 150. The upper contact 151 may penetrate the first upper interlayer insulating layer 150 and the upper interface layer UE and may be in contact with the third lower interconnection line 135. The upper contacts 151 may be electrically connected to the first to third lower interconnection lines 131, 133 and 135 and the first and second lower contacts 111 and 113. First and second upper interconnection lines 171C and 171P may be provided in the second upper interlayer insulating layer 170. The first and second upper interconnection lines 171C and 171P may be in contact with top surfaces of the upper contacts 151. The first upper interconnection line 171C may be provided in the second upper interlayer insulating layer 170 over the cell array region CAR, and the second upper interconnection line 171P may be provided in the second upper interlayer insulating layer 170 over the peripheral circuit region PCR. An upper width of each of the first and second upper interconnection lines 171C and 171P may be less than a lower width thereof. The first upper interlayer insulating layer 150 may include a protrusion 150P protruding toward the first upper interconnection line 171C or the second upper interconnection line 171P. A top surface of the protrusion 150P may be in contact with a bottom surface 171Cb of the first upper interconnection line 171C or a bottom surface 171Pb of the second upper interconnection line 171P.

The upper contact 151 may penetrate the first upper interlayer insulating layer 150 to connect a corresponding one of the first and second upper interconnection lines 171C and 171P to a corresponding one of the third lower interconnection lines 135. For example, the upper contact 151 may include at least one of tungsten (W), titanium (Ti), tantalum (Ta), or any nitride thereof. The first and second upper interconnection lines 171C and 171P may include a different conductive material than that of the first to third lower interconnection lines 131, 133 and 135. For example, the first to third lower interconnection lines 131, 133 and 135 may include a first metal, and the first and second upper interconnection lines 171C and 171P may include a second metal different from the first metal. For example, the first and second upper interconnection lines 171C and 171P may include aluminum (Al). The top surface of the protrusion 150P may be substantially coplanar with the top surface of the upper contact 151.

A blocking layer HBL may be provided between the first upper interlayer insulating layer 150 and the second upper interlayer insulating layer 170. The blocking layer HBL may include a material having low hydrogen permeability. For example, the blocking layer HBL may include at least one of aluminum oxide (AlOx), tungsten oxide (WOx), or silicon nitride (SiNx). The hydrogen permeability of the blocking layer HBL may be lower than hydrogen permeability of the upper interface layer UE and a passivation layer 190 to be described later.

The blocking layer HBL may be conformally disposed along a top surface of the first upper interlayer insulating layer 150. A thickness of the blocking layer HBL may range from about 10 Å to about 1000 Å. The blocking layer HBL may be absent between the bottom surface 171Cb of the first upper interconnection line 171C and the first upper interlayer insulating layer 150. The blocking layer HBL may be absent between the bottom surface 171Pb of the second upper interconnection line 171P and the first upper interlayer insulating layer 150. The blocking layer HBL may be spaced apart from the upper contact 151.

The second upper interlayer insulating layer 170 may cover the first and second upper interconnection lines 171C and 171P. The second upper interlayer insulating layer 170 may cover a top surface and a sidewall of each of the first and second upper interconnection lines 171C and 171P. The second upper interlayer insulating layer 170 may include extensions 170P. The extensions 170P may be portions of the second upper interlayer insulating layer 170, which protrude toward the passivation layer 190 to be described later. Each of the extensions 170P may vertically overlap with at least one of the first upper interconnection line 171C or the second upper interconnection line 171P. Thus, a top surface of the second upper interlayer insulating layer 170 may not need to have a flat profile.

At least one of the first and second lower contacts 111 and 113, the first to third lower interconnection lines 131, 133 and 135, the upper contacts 151 and the first and second upper interconnection lines 171C and 171P may include a barrier layer Ba. The barrier layer Ba may be provided on a bottom surface and a sidewall of at least one of the first and second lower contacts 111 and 113, the first to third lower interconnection lines 131, 133 and 135, the upper contacts 151 and the first and second upper interconnection lines 171C and 171P. The barrier layer Ba may include a conductive metal nitride such as titanium nitride (TiN) or tantalum nitride (TaN).

The passivation layer 190 may be provided on the second upper interlayer insulating layer 170. In some embodiments, the passivation layer 190 may include the same material as the upper interface layer UE. For example, the passivation layer 190 may include silicon nitride (SiN). In some embodiments, a density of silicon nitride (SiN) of the passivation layer 190 may be less than a density of silicon nitride (SiN) of the upper interface layer UE. The hydrogen permeability of the passivation layer 190 may be higher than the hydrogen permeability of the upper interface layer UE and the hydrogen permeability of the blocking layer HBL. A top surface of the passivation layer 190 may not need to have a flat profile.

At least one of the first and second upper interlayer insulating layers 150 and 170 may be an insulating layer having a high hydrogen concentration and/or a high hydrogen supply capacity. The insulating layer having the high hydrogen concentration and/or the high hydrogen supply capacity may include, for example, tetraethyl orthosilicate (TEOS). In some embodiments, the hydrogen concentration and/or the hydrogen supply capacity of the second upper interlayer insulating layer 170 may be higher than that (or those) of the first upper interlayer insulating layer 150. For some examples, the first upper interlayer insulating layer 150 may be a TEOS layer including tetraethyl orthosilicate (TEOS), and the second upper interlayer insulating layer 170 may be a HDP layer including a high density plasma CVD (HDP CVD) dielectric. For certain examples, both the first upper interlayer insulating layer 150 and the second upper interlayer insulating layer 170 may be the HDP layers. For certain examples, the second upper interlayer insulating layer 170 may be the TEOS layer, and the first upper interlayer insulating layer 150 may be the HDP layer. Hereinafter, in the present disclosure, 'hydrogen' may refer to hydrogen atoms or hydrogen molecules.

According to some embodiments of the inventive concept, the second upper interlayer insulating layer 170 in the interconnection region LLR may supply hydrogen into the cell array region CAR and the peripheral circuit region PCR in a thermal treatment process to be described later. For example, hydrogen may be supplied from the second upper interlayer insulating layer 170 into the cell array region CAR through a hydrogen supply path 5 passing through the first upper interconnection line 171C, the upper contact 151, the first to third lower interconnection lines 131, 133 and 135 and the first lower contact 111. In addition, hydrogen may be supplied from the second upper interlayer insulating layer 170 into the peripheral circuit region PCR through a hydrogen supply path 5 passing through the second upper interconnection line 171P, the upper contact 151, the first to third lower interconnection lines 131, 133 and 135 and the second lower contact 113. However, the hydrogen supply paths 5 shown in FIG. 2 are illustrated only as examples. Hydrogen may be supplied through various other paths through the lower contacts 111 and 113, the first to third lower interconnection lines 131, 133 and 135, the upper contacts 151 and the first and second upper interconnection lines 171C and 171P.

The blocking layer HBL will be described in more detail with reference to FIG. 3.

Referring to FIG. 3, the blocking layer HBL may include a first portion PO1 extending in a direction parallel to the bottom surface 171Pb of the second upper interconnection line 171P, and a second portion PO2 extending along a sidewall of the protrusion 150P of the first upper interlayer insulating layer 150. The blocking layer HBL may not be in contact with the bottom surface 171Pb of the second upper interconnection line 171P. The blocking layer HBL may be absent between the bottom surface 171Pb of the second upper interconnection line 171P and the first upper interlayer insulating layer 150. The blocking layer HBL may be spaced apart from a sidewall of the upper contact 151. A top surface of the second portion PO2 of the blocking layer HBL may be substantially coplanar with the top surface of the protrusion 150P or the top surface of the upper contact 151.

If the blocking layer HBL is not provided, hydrogen supplied from the second upper interlayer insulating layer 170 may not travel through to the hydrogen supply path 5 but may pass through the first upper interlayer insulating layer 150, the upper interface layer UE, the first and second intermediate interface layers ME1 and ME2 and the low-k dielectric layers LK1, LK2 and LK3. Diffused hydrogen may react with at least one of Si, O, C and H of the low-k dielectric layers LK1, LK2 and LK3 to generate a gas, and thus voids may be generated at an interface. For example, voids may be generated at an interface between the third low-k dielectric layer LK3 and the upper interface layer UE. The voids may be generated at an interface between the interface layer and the low-k dielectric layer, thereby causing defects such as in a delamination phenomenon. However, according to embodiments of the inventive concept, the blocking layer HBL may be provided to prevent hydrogen atoms or molecules from passing through the first upper interlayer insulating layer 150, such as hydrogen movement path 6 illustrated in FIG. 3. As a result, electrical characteristics and reliability of the semiconductor device may be improved.

Typically, electrical characteristics of a semiconductor device may deteriorate by defects generated at a unit device in a manufacturing process (e.g., an oxidation process and/or a plasma etching process). For example, dangling bonds may be formed at an interface between an oxide layer of the unit device and a substrate, and thus a leakage current may increase and thus deteriorate the electrical characteristics of the semiconductor device. A DRAM device may require an operation of writing stored data repeatedly at regular periods by using a refresh method for newly writing data. In this case, the regular period may be referred to as a refresh period or a data retention time. An increase in data retention time may be required to reduce power consumption of the DRAM device and to increase an operation speed of the DRAM device. However, by structural defects in a silicon crystal (e.g., the dangling bonds described above), the leakage current of transistors may increase and the data retention time may be reduced. However, according to the embodiments of the inventive concept, hydrogen capable of supplying electrons to the dangling bonds may be supplied to the transistors to prevent reduction in data retention time.

The semiconductor device according to the embodiments of the inventive concept may have the hydrogen supply path 5 reaching the cell array region CAR or the peripheral circuit region PCR, thereby improving their electrical characteristics. In addition, the passage of hydrogen may be selectively blocked or prevented by the blocking layer HBL, thereby preventing deterioration of the reliability of the semiconductor device.

Figure 4:
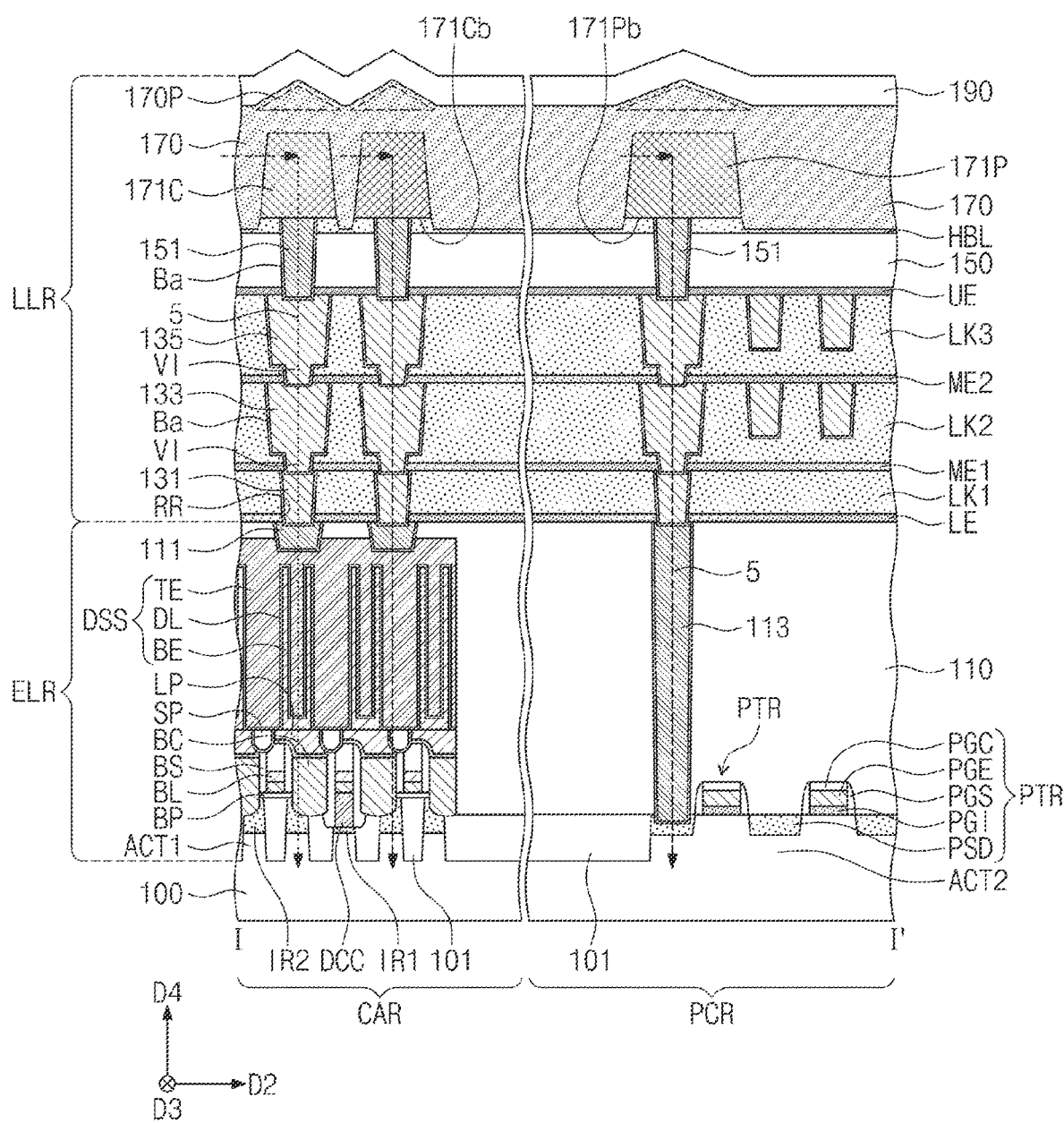
FIG. 4 is a cross-sectional view corresponding to the line I-I' of FIG. 1 to illustrate a semiconductor device according to a comparative example.

FIG. 4 is a cross-sectional view corresponding to the line I-I' of FIG. 1 to illustrate a semiconductor device according to a comparative example. Hereinafter, differences between the comparative example and the embodiments described with reference to FIGS. 2 and 3 will be described.

Referring to FIG. 4, a first upper interlayer insulating layer 150 may not include the protrusion 150P described with reference to FIGS. 2 and 3. A blocking layer HBL may be provided between the first upper interlayer insulating layer 150 and the second upper interlayer insulating layer 170. The blocking layer HBL may be in contact with the bottom surface 171Cb of the first upper interconnection line 171C. The blocking layer HBL may be in contact with the bottom surface 171Pb of the second upper interconnection line 171P. In other words, a portion of the blocking layer HBL may be disposed between the bottom surface 171Cb of the first upper interconnection line 171C and the first upper interlayer insulating layer 150 and may be disposed between the bottom surface 171Pb of the second upper interconnection line 171P and the first upper interlayer insulating layer 150. The blocking layer HBL may be in contact with the upper contact 151. Particularly, the blocking layer HBL may be in contact with a sidewall of the upper contact 151.

A thickness of the portion of the blocking layer HBL disposed between the first upper interconnection line 171C (or the second upper interconnection line 171P) and the first upper interlayer insulating layer 150 may be greater than a thickness of another portion of the blocking layer HBL disposed between the first and second upper interlayer insulating layers 150 and 170.

In a semiconductor device according to the comparative example, the bottom surface 171Cb of the first upper interconnection line 171C or the bottom surface 171Pb of the second upper interconnection line 171P may be in contact with the portion of the blocking layer HBL, which is thick. In addition, the upper contact 151 may be in contact with the thick portion of the blocking layer HBL. In this case, a RC value between the first or second upper interconnection line 171C or 171P and the blocking layer HBL may increase, and a RC value between the upper contact 151 and the blocking layer HBL may increase. Accordingly, the RC delay of the semiconductor device may increase, and thus electrical characteristics of the semiconductor device may deteriorate. In addition, to form the blocking layer HBL according to a comparative example, a thick blocking layer HBL may be formed, and then, the thick blocking layer HBL may be selectively etched. Thus, the complexity of processes may increase, and the productivity of the semiconductor device may be reduced.

Referring again to FIGS. 1 to 3, in the semiconductor device according to the embodiments of the inventive concept, the blocking layer HBL may not be in contact with the bottom surface 171Cb of the first upper interconnection line 171C and/or the bottom surface 171Pb of the second upper interconnection line 171P. In addition, the blocking layer HBL may be spaced apart from the upper contact 151. Thus, an RC delay of the semiconductor device according to the embodiments of the inventive concept may be reduced as compared with the comparative example. As a result, the electrical characteristics of the semiconductor device may be improved. In addition, as compared with the comparative example, the complexity of the processes may be reduced and the productivity of the semiconductor device may be improved. These will be described later in greater detail.

FIGS. 5 to 11 are cross-sectional views corresponding to the line I-I' of FIG. 1 to illustrate a method of manufacturing a semiconductor device according to some embodiments of the inventive concept.

Figure 5:
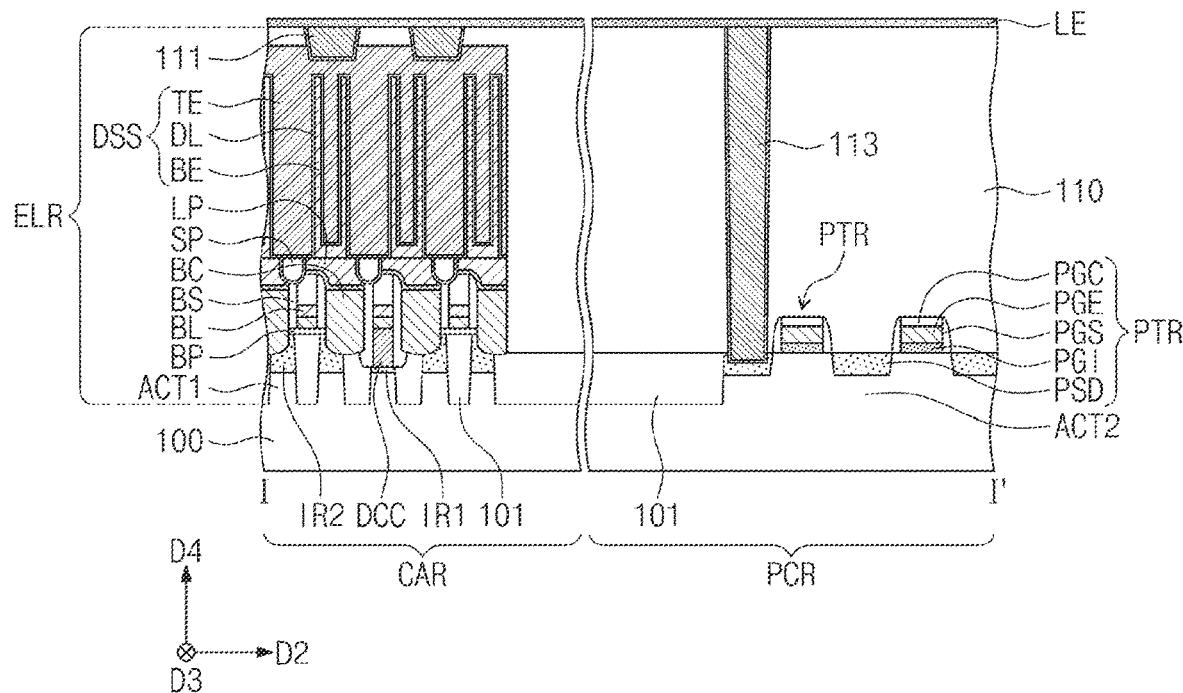
FIGS. 5 to 11 are cross-sectional views corresponding to the line I-I' of FIG. 1 to illustrate a method of manufacturing a semiconductor device according to some embodiments of the inventive concept.

Referring to FIG. 5, an integrated circuit region ELR may be formed. The formation of the integrated circuit region ELR may include forming a device isolation layer 101 defining first active regions ACT1 in an upper portion of a substrate 100 of a cell array region CAR, forming word lines WL, forming first dopant regions IR1 and second dopant regions IR2 in upper portions of the first active regions ACT1, forming bit line contacts DCC connected to the first dopant regions IR1, forming bit lines BL, forming node contacts BC connected to the second dopant regions IR2, and forming a data storage structure DSS on the node contacts BC. The formation of the data storage structure DSS may include sequentially forming bottom electrodes BE connected to the node contacts BC, a dielectric layer DL, and a top electrode TE.

The formation of the integrated circuit region ELR may include forming a device isolation layer 101 defining a second active region ACT2 in an upper portion of the substrate 100 of a peripheral circuit region PCR, and forming a plurality of peripheral transistors PTR on the second active region ACT2.

A lower interlayer insulating layer 110 may be formed to cover the data storage structure DSS on the cell array region CAR and the peripheral transistors PTR on the peripheral circuit region PCR. Contact holes may be formed to penetrate at least a portion of the lower interlayer insulating layer 110, and then, first and second lower contacts 111 and 113 may be formed in the contact holes. For example, the contact hole of the integrated circuit region ELR on the cell array region CAR may expose the top electrode TE of the data storage structure DSS, and thus the first lower contact 111 may be connected to the data storage structure DSS on the cell array region CAR. For example, the contact hole of the integrated circuit region ELR on the peripheral circuit region PCR may expose one of the source/drain regions PSD of the peripheral transistors PTR, and thus the second lower contact 113 may be connected to one of the source/drain regions PSD. The first and second lower contacts 111 and 113 may be formed by a deposition process (e.g., a sputtering process or a MOCVD process) and a planarization process (e.g., a chemical mechanical polishing (CMP) process) after the deposition process.

A top surface of the lower interlayer insulating layer 110 may be exposed by the planarization process. In some embodiments, a surface treatment process may be performed on the lower interlayer insulating layer 110 exposed by the planarization process. For example, the surface treatment process may be performed by at least one of a gas treatment process using $NH_3$, $H_2$, Ar, $N_2$ and/or $SiH_4$, a direct (or remote) plasma treatment process, or an ultraviolet (UV) treatment process. After the surface treatment process, a lower interface layer LE may be formed on the lower interlayer insulating layer 110.

Figure 6:
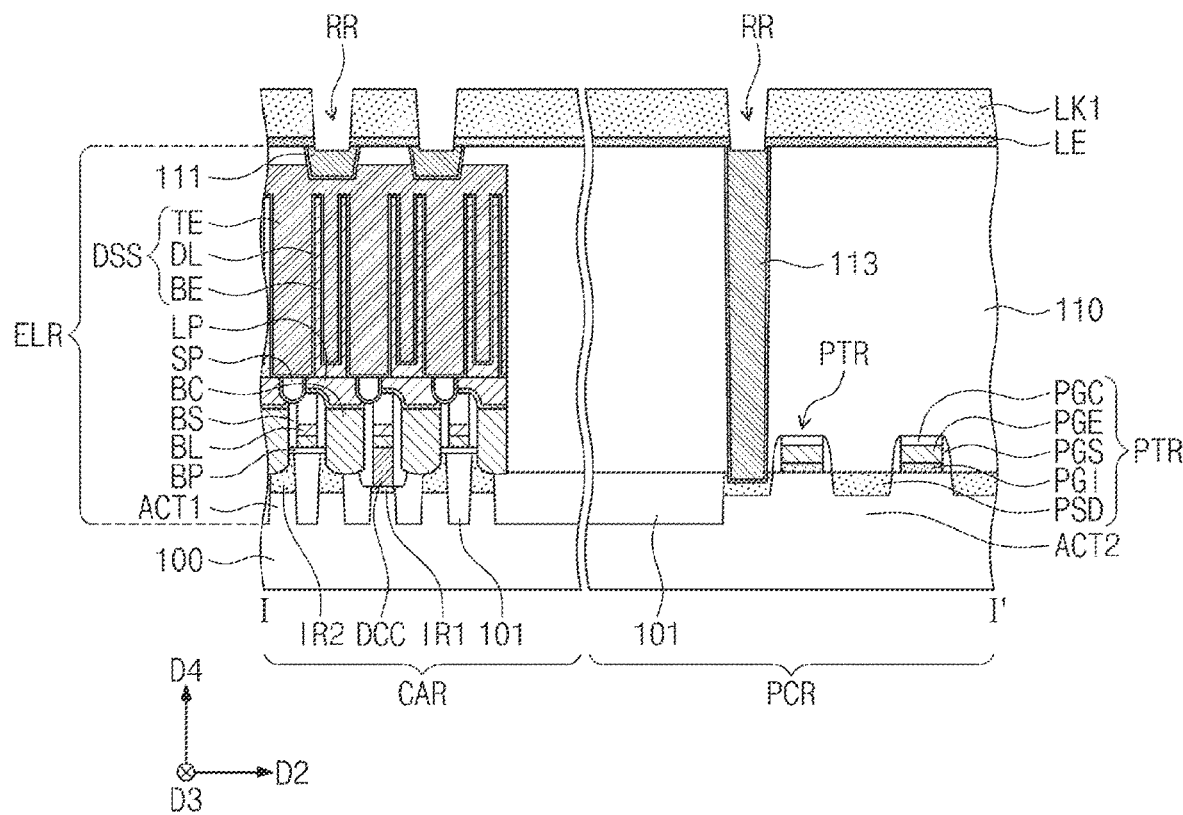

Referring to FIG. 6, a first low-k dielectric layer LK1 may be formed on the lower interface layer LE. For example, the first low-k dielectric layer LK1 may be formed of SiOCH. A mask pattern may be formed on the first low-k dielectric layer LK1, and then, an etching process may be performed on the first low-k dielectric layer LK1 to expose the first and second lower contacts 111 and 113. In some embodiments, portions of the first and second lower contacts 111 and 113 may be etched in the etching process. The lower interface layer LE may function as an etch stop layer in the etching process. Recess regions RR may be formed in the first low-k dielectric layer LK1. The recess regions RR may be regions defined by top surfaces of the first and second lower contacts 111 and 113, sidewalls of the lower interface layer LE and sidewalls of the first low-k dielectric layer LK1. The etching process may be performed using a dry etching process and/or a wet etching process.

Figure 7:
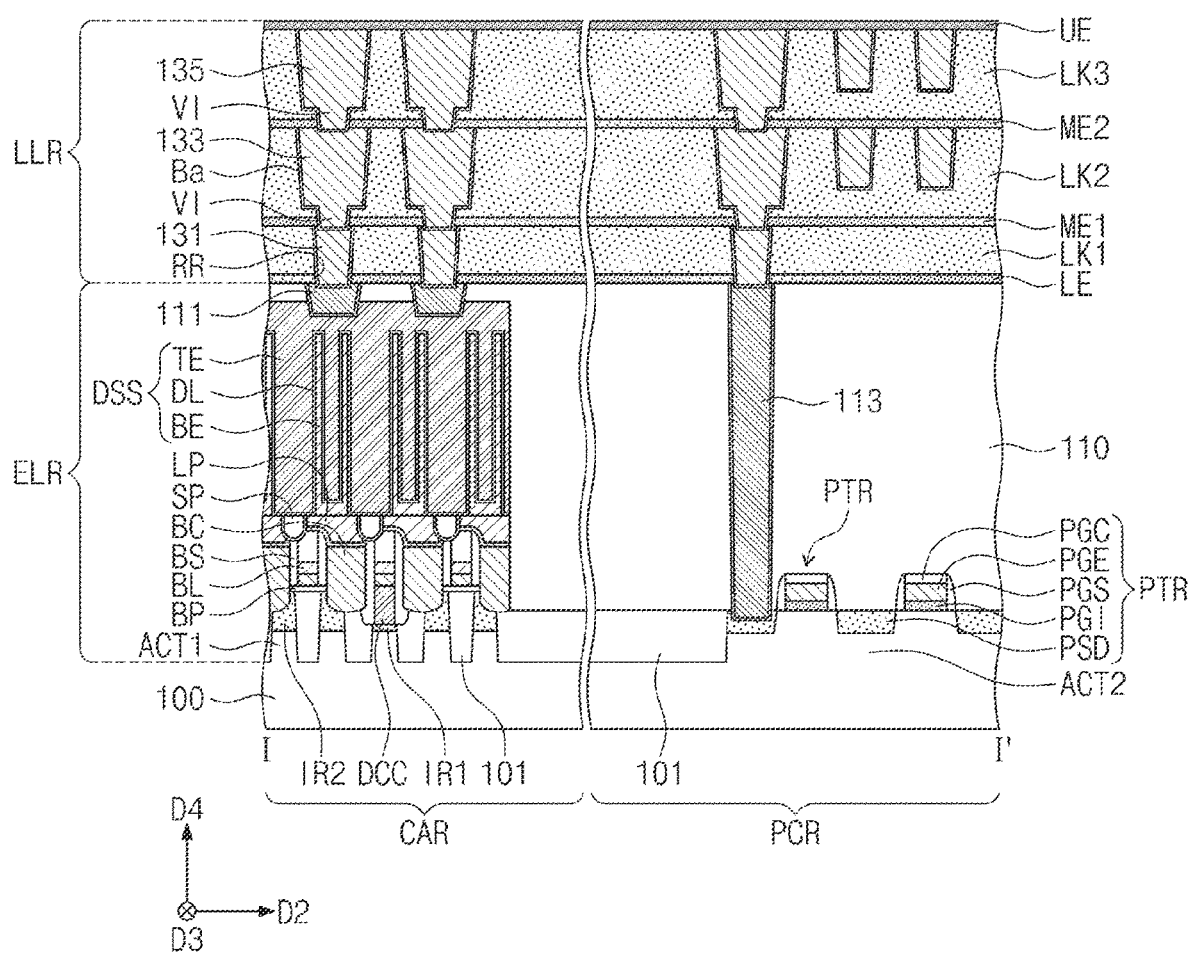

Referring to FIG. 7, first lower interconnection lines 131 may be formed to fill the recess regions RR, respectively. For example, the first lower interconnection lines 131 may be formed by a damascene process using copper (Cu) or tungsten (W). Thereafter, a damascene process may be repeatedly performed to form second and third lower interconnection lines 133 and 135. At least one of the first to third lower interconnection lines 131, 133 and 135 may be formed by a dual damascene process. Due to the damascene processes, an upper width of each of the first to third lower interconnection lines 131, 133 and 135 may be greater than a lower width thereof.

An upper interface layer UE may be formed to cover the third lower interconnection lines 135. The upper interface layer UE and first and second intermediate interface layers ME1 and ME2 thereunder may be formed by processes corresponding to the process of forming the lower interface layer LE described above. Thus, a portion of an interconnection region LLR may be formed on the integrated circuit region ELR.

Figure 8:
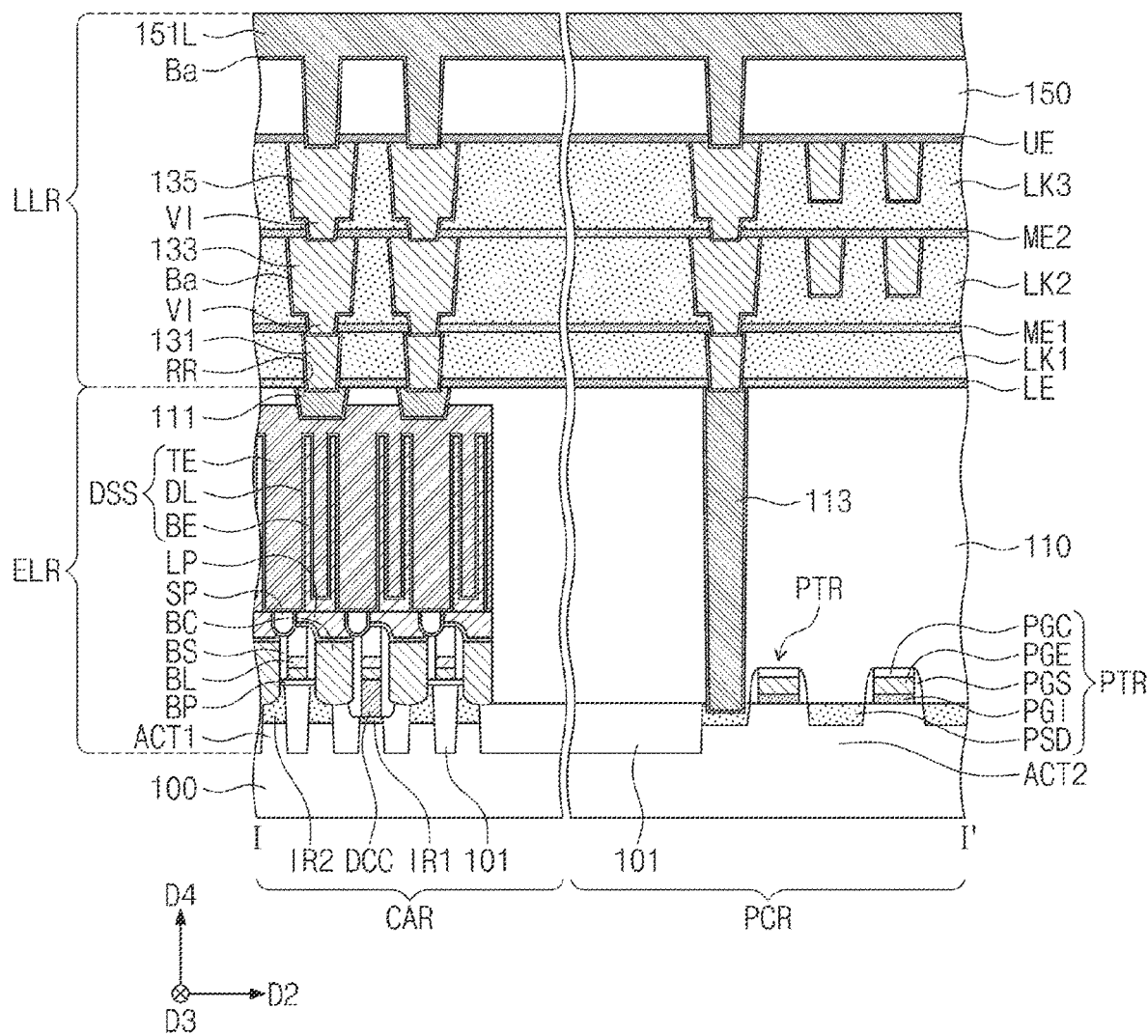

Referring to FIG. 8, a first upper interlayer insulating layer 150 may be formed on the upper interface layer UE. Thereafter, a mask pattern may be formed on the first upper interlayer insulating layer 150, and then, an etching process may be performed to form contact holes penetrating at least a portion of the first upper interlayer insulating layer 150. Portions of the third lower interconnection lines 135 may be exposed by the etching process. In other words, the upper interface layer UE and the portions of the third lower interconnection lines 135 may be etched by the etching process.

A preliminary upper contact layer 151L may be formed to fill the contact holes. The preliminary upper contact layer 151L may penetrate the upper interface layer UE so as to be connected to the third lower interconnection lines 135. The preliminary upper contact layer 151L may include vertical portions filling the contact holes, and a horizontal portion on the first upper interlayer insulating layer 150. The vertical portions and the horizontal portion may be formed in one body.

Figure 9:
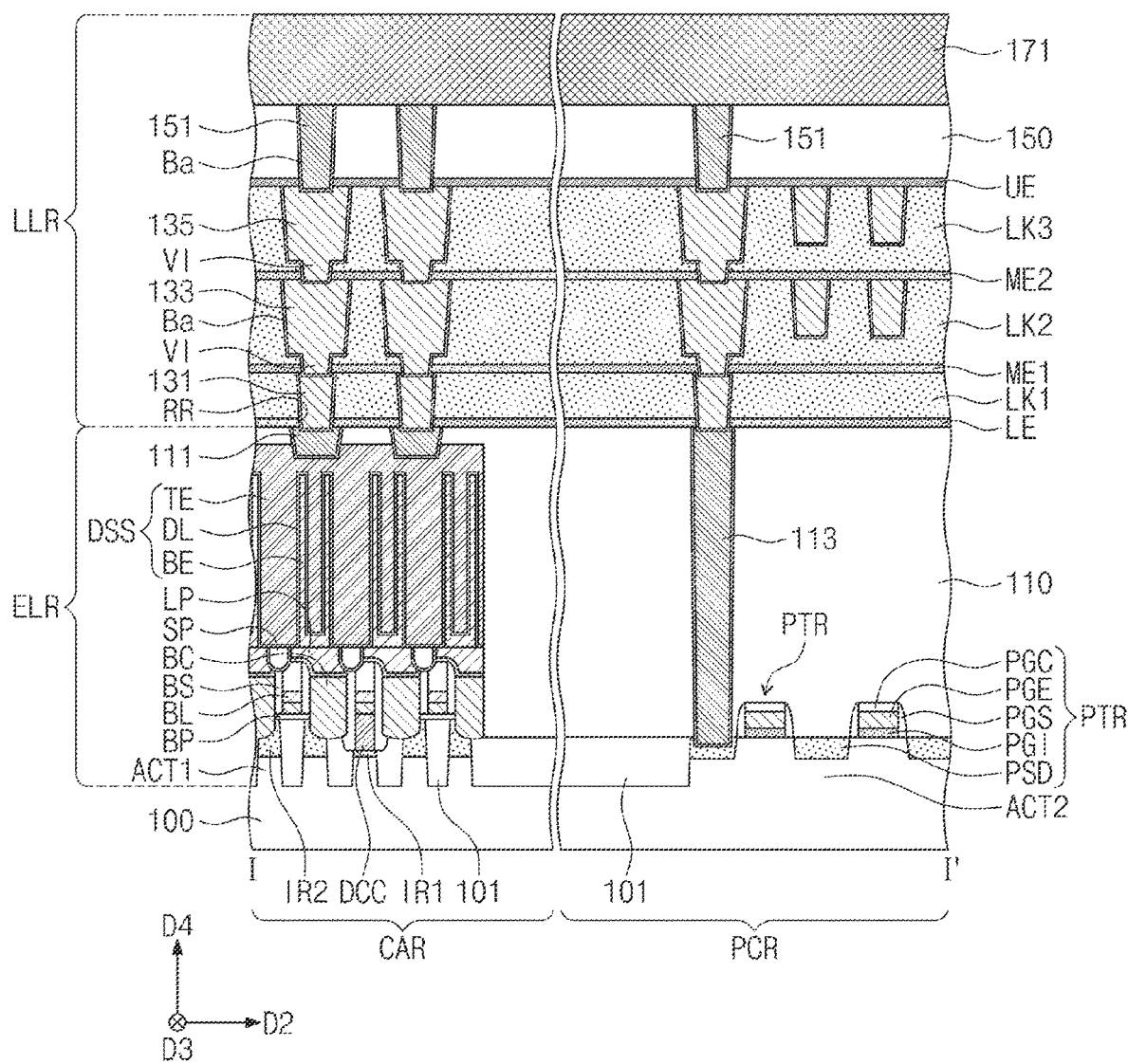

Referring to FIG. 9, a planarization process may be performed on the preliminary upper contact layer 151L to expose a top surface of the first upper interlayer insulating layer 150. Upper contacts 151 may be formed by the planarization process. Top surfaces of the upper contacts 151 may be substantially coplanar with the top surface of the first upper interlayer insulating layer 150.

An upper interconnection layer 171 may be formed on the first upper interlayer insulating layer 150 and the upper contacts 151. The upper interconnection layer 171 may be formed by a deposition process. For example, the upper interconnection layer 171 may include aluminum (Al).

Figure 10:
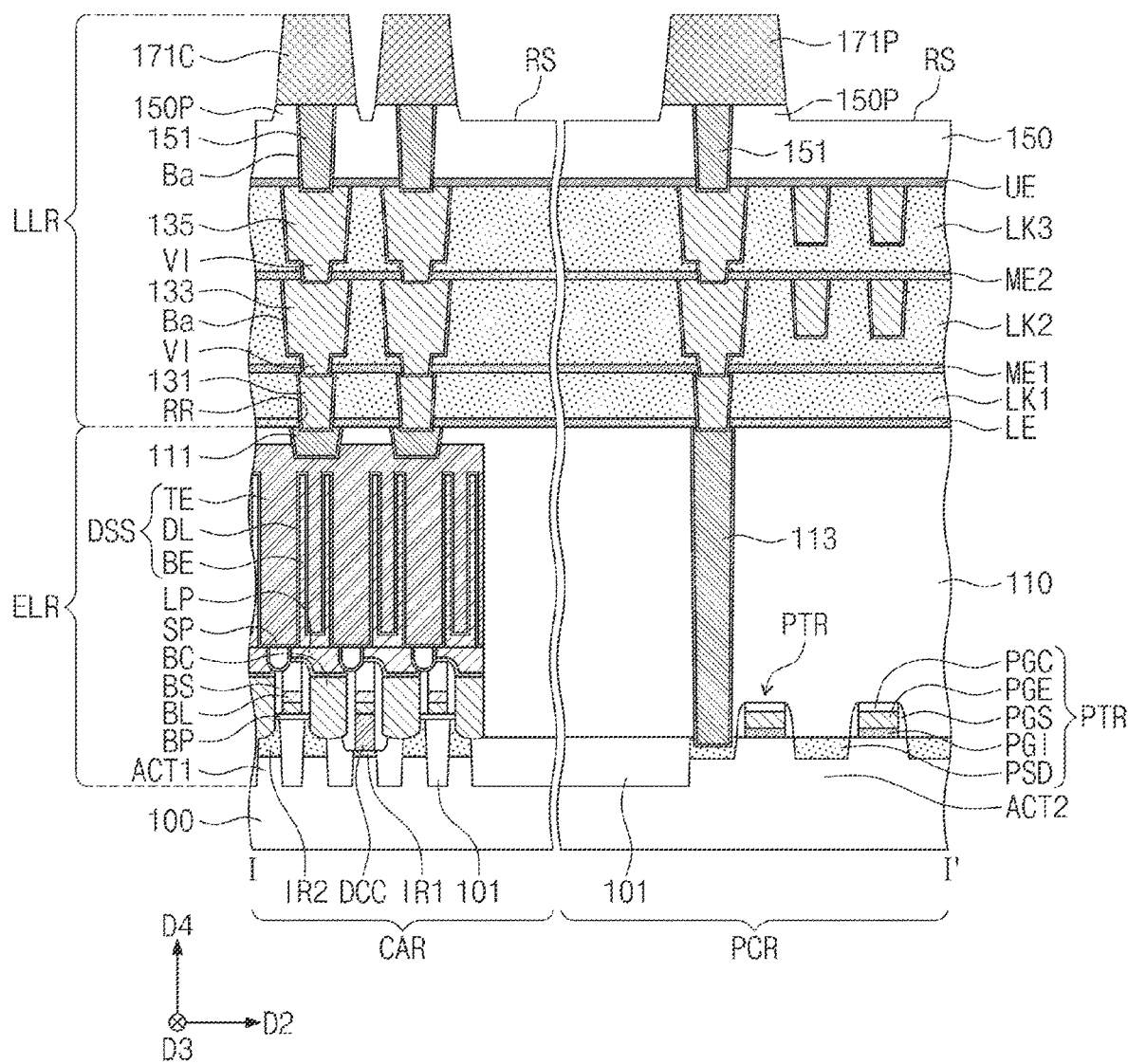

Referring to FIG. 10, a mask pattern may be formed on the upper interconnection layer 171, and then, an etching process may be performed on the upper interconnection layer 171 to expose the top surface of the first upper interlayer insulating layer 150. By the etching process, a first upper interconnection line 171C may be formed on the cell array region CAR, and a second upper interconnection line 171P may be formed on the peripheral circuit region PCR. An upper width of each of the first and second upper interconnection lines 171C and 171P may be less than a lower width thereof.

Protrusions 150P may be formed at an upper portion of the first upper interlayer insulating layer 150 by the etching process. Each of the protrusions 150P may be a portion protruding toward the first upper interconnection line 171C or the second upper interconnection line 171P. Recesses RS may be formed in an upper portion of the first upper interlayer insulating layer 150 by over-etching by the etching process, and thus the protrusions 150P may be formed. Bottom surfaces of the recesses RS may be located at a lower level than a bottom surface of the first upper interconnection line 171C and/or a bottom surface of the second upper interconnection line 171P.

Figure 11:
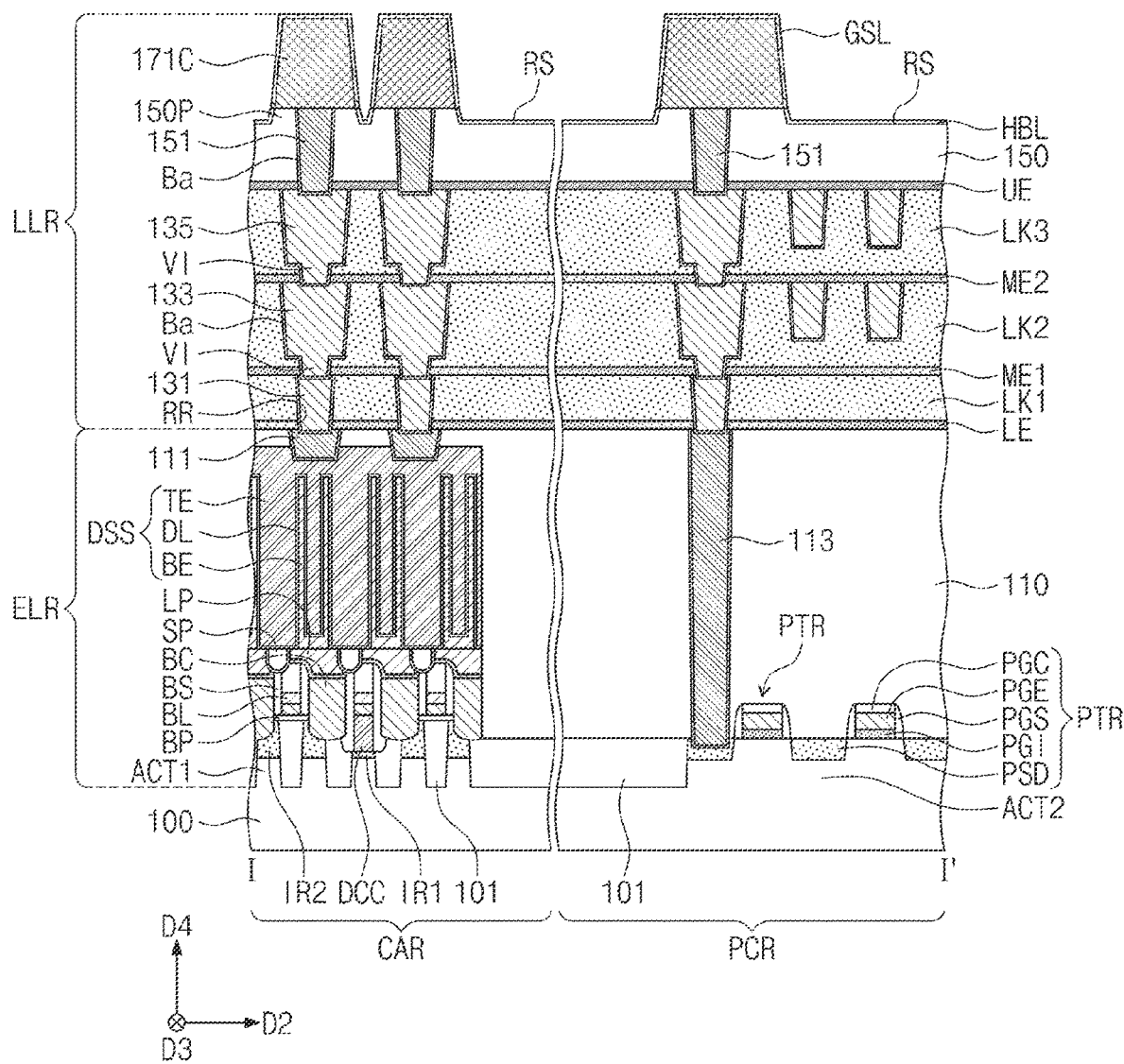

Referring to FIG. 11, a growth prevention layer GSL may be formed to cover a top surface and a sidewall of each of the first and second upper interconnection lines 171C and 171P. The growth prevention layer GSL may be selectively formed on the first upper interconnection line 171C and the second upper interconnection line 171P. The growth prevention layer GSL may function as a mask preventing growth of a blocking layer HBL. For example, the growth prevention layer GSL may include at least one of Si, Cu, octadecylphosphonic acid (ODPA; $C_{18}H_{39}O_3P$), or poly (methyl methacrylate) (PMMA). The growth prevention layer GSL may be formed by an area-selective deposition process or may be formed by a coating process and a patterning process.

The blocking layer HBL may be formed on the first upper interlayer insulating layer 150. The blocking layer HBL may be conformally formed on the first upper interlayer insulating layer 150. The blocking layer HBL may be selectively formed on the first upper interlayer insulating layer 150 by using an area-selective atomic layer deposition (ALD) process. For example, a thickness of the blocking layer HBL may range from about 10 Å to about 1000 Å.

According to the embodiments of the inventive concept, a process of forming a thick blocking layer and a process of selectively etching the thick blocking layer may be omitted, and the blocking layer HBL may be selectively formed on the first upper interlayer insulating layer 150 by using the area-selective ALD process. As a result, the complexity of processes may be reduced and the productivity of the semiconductor device may be improved.

Referring again to FIG. 2, the growth prevention layer GSL may be selectively removed, and then, a second upper interlayer insulating layer 170 may be formed to cover the first and second upper interconnection lines 171C and 171P and the blocking layer HBL. A passivation layer 190 may be formed on the second upper interlayer insulating layer 170. The second upper interlayer insulating layer 170 may include an extension 170P vertically overlapping with the first upper interconnection line 171C or the second upper interconnection line 171P. The extension 170P may be a portion protruding toward the passivation layer 190. Thus, top surfaces of the second upper interlayer insulating layer 170 and the passivation layer 190 may have other than a flat profile.

Thereafter, a thermal treatment process may be performed. For example, the thermal treatment process may be performed at a temperature of about 300 degrees Celsius to about 500 degrees Celsius for a time of tens of minutes to hundreds of minutes. Heat of the thermal treatment process may be applied to the passivation layer 190 and may be transferred through the hydrogen supply path 5. The passivation layer 190 may prevent the escape of hydrogen in a direction opposite to the hydrogen supply path 5 during the thermal treatment process.

Hydrogen on the second upper interlayer insulating layer 170 may be transferred onto the substrate 100 through the hydrogen supply path 5 by the thermal treatment process. However, in the thermal treatment process, the blocking layer HBL may prevent hydrogen from the second upper interlayer insulating layer 170 from passing through the first upper interlayer insulating layer 150, the upper interface layer UE and the low-k dielectric layers LK1, LK2 and LK3, instead of the hydrogen supply path 5.

Figure 12:
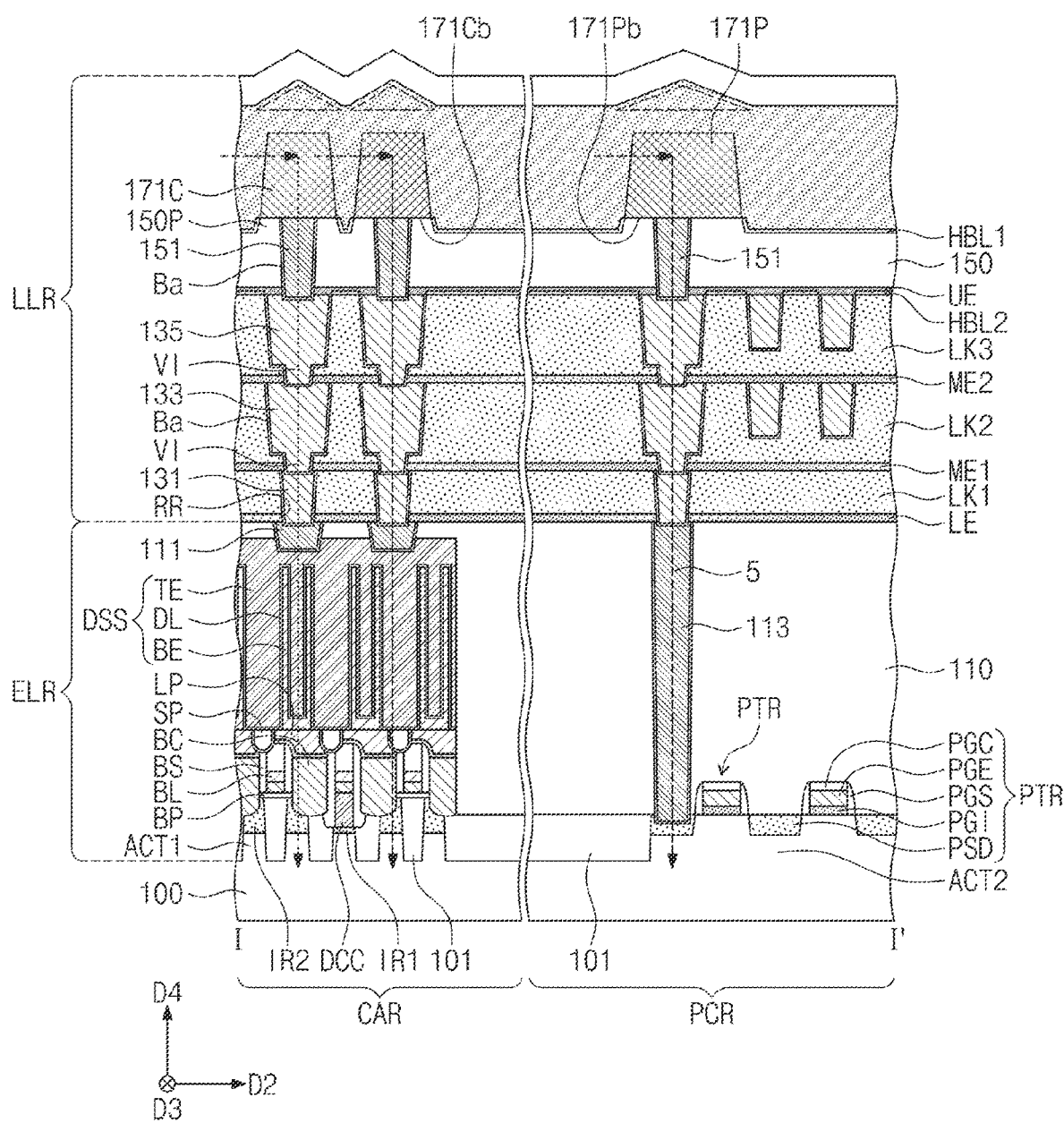
FIG. 12 is a cross-sectional view taken along the line I-I' of FIG. 1 to illustrate a semiconductor device according to some embodiments of the inventive concept.

FIG. 12 is a cross-sectional view taken along the line I-I' of FIG. 1 to illustrate a semiconductor device according to some embodiments of the inventive concepts. Hereinafter, the descriptions to substantially the same features and components as in the embodiments of FIGS. 2 and 3 will be omitted for the purpose of ease and convenience in explanation. In other words, differences between the present embodiments and the embodiments of FIGS. 2 and 3 will be mainly described.

Referring to FIG. 12, a first blocking layer HBL1 may be provided between the first upper interlayer insulating layer 150 and the second upper interlayer insulating layer 170, and a second blocking layer HBL2 may be provided between the upper interface layer UE and the third low-k dielectric layer LK3. The first blocking layer HBL1 may be substantially the same as the blocking layer HBL described with reference to FIGS. 2 and 3.

The second blocking layer HBL2 may include the same material as the first blocking layer HBL1. For example, the second blocking layer HBL2 may include at least one of aluminum oxide (AlOx), tungsten oxide (WOx), or silicon nitride (SiNx). The second blocking layer HBL2 may be in contact with the third low-k dielectric layer LK3. The second blocking layer HBL2 may be spaced apart from the first upper interlayer insulating layer 150 by the upper interface layer UE. The second blocking layer HBL2 may be spaced apart from the upper contact 151.

Since a second blocking layer HBL2 is additionally provided on the third low-k dielectric layer LK3, it is possible to prevent hydrogen supplied from the second upper interlayer insulating layer 170 from passing through the low-k dielectric layers LK1, LK2 and LK3. As a result, electrical characteristics and reliability of the semiconductor device may be improved.

Figure 13:
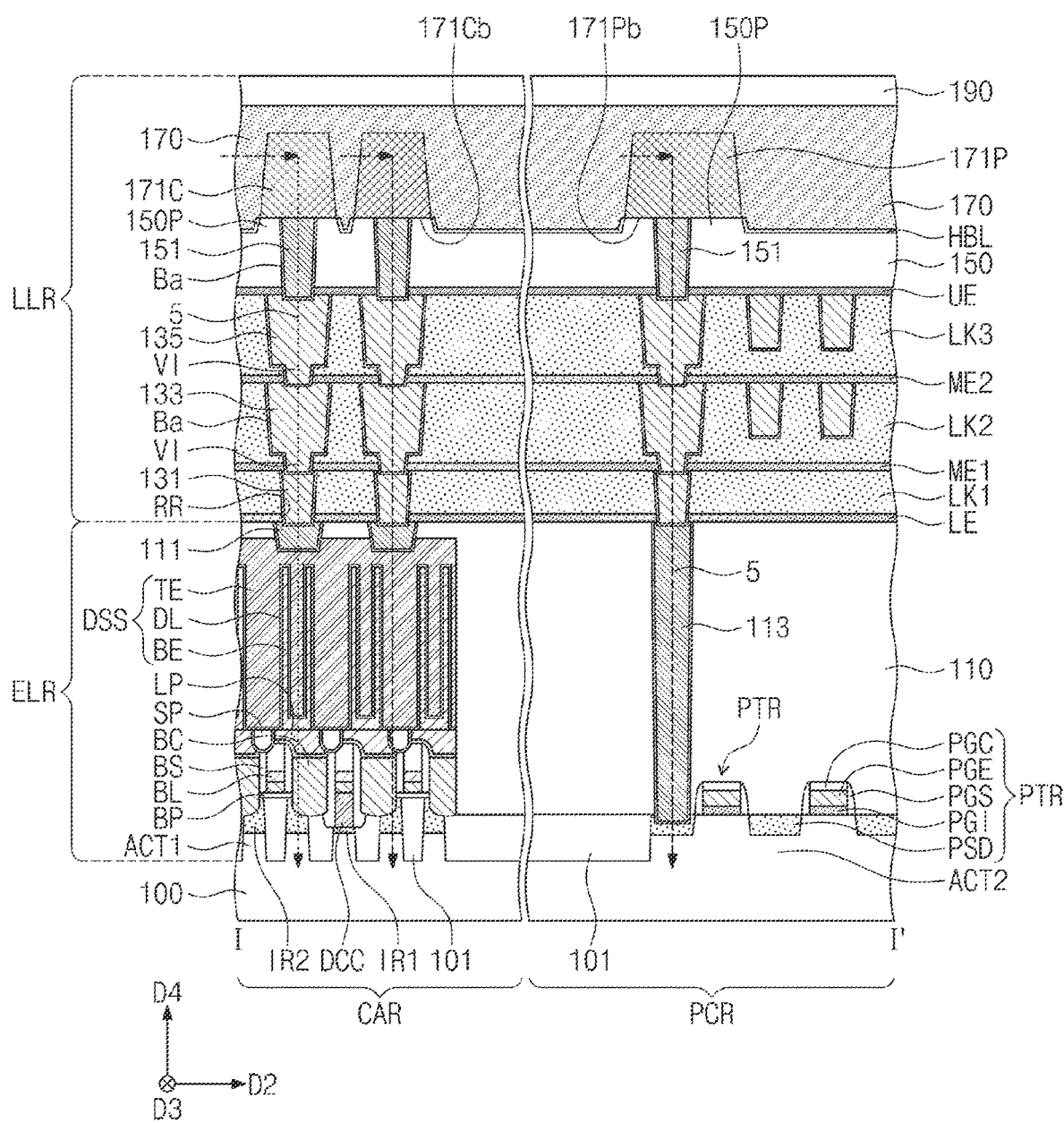
FIG. 13 is a cross-sectional view taken along the line I-I' of FIG. 1 to illustrate a semiconductor device according to some embodiments of the inventive concept.

FIG. 13 is a cross-sectional view taken along the line I-I' of FIG. 1 to illustrate a semiconductor device according to some embodiments of the inventive concept. Hereinafter, the descriptions to substantially the same features and components as in the embodiments of FIGS. 2 and 3 will be omitted for the purpose of ease and convenience in explanation. In other words, differences between the present embodiments and the embodiments of FIGS. 2 and 3 will be described.

Referring to FIG. 13, a second upper interlayer insulating layer 170 may not include the extension 170P. In other words, each of the second upper interlayer insulating layer 170 and the passivation layer 190 may have a flat top surface.

The semiconductor device according to the inventive concept may include the blocking layer provided between the first and second upper interlayer insulating layers to prevent hydrogen supplied from the second upper interlayer insulating layer from passing through the first upper interlayer insulating layer, the interface layers and the low-k dielectric layers. Thus, it is possible to prevent a delamination phenomenon which may be caused by voids formed at an interface between the interface layer and the low-k dielectric layer.

In addition, the blocking layer may not be disposed between the bottom surface of the upper interconnection line and the first upper interlayer insulating layer and may be spaced apart from the upper contact. Thus, RC values between the blocking layer and the upper interconnection line and between the blocking layer and the upper contact may be reduced to inhibit or minimize a RC delay phenomenon. As a result, the electrical characteristics and reliability of the semiconductor device may be improved.

While the inventive concepts have been described with reference to exemplary embodiments, it will be apparent to those skilled in the art that various changes and modifications may be made without departing from the spirit and scope of the inventive concept. Therefore, it should be understood that the above described embodiments are not limiting, but only illustrative. Thus, the scope of the inventive concept are to be determined by the broadest interpretation of the following claims and their equivalents, and shall not be restricted or limited by the foregoing description.

What is claimed is:

1. A semiconductor device comprising:
 a substrate including a cell array region and a peripheral circuit region;
 capacitors provided on the cell array region of the substrate;
 peripheral transistors provided on the peripheral circuit region of the substrate;
 a first upper interlayer insulating layer provided on the capacitors and the peripheral transistors;
 a first upper contact electrically connected to at least one of the peripheral transistors, the first upper contact penetrating the first upper interlayer insulating layer;
 a first upper interconnection line provided on the first upper interlayer insulating layer and electrically connected to the first upper contact;
 a second upper interlayer insulating layer covering the first upper interconnection line; and
 a first blocking layer disposed between the first upper interlayer insulating layer and the second upper interlayer insulating layer,
 wherein the first blocking layer contacts the first and second interlayer insulating layers and is absent between the first upper interconnection line and the first upper interlayer insulating layer.

2. The semiconductor device of claim 1, wherein the first blocking layer includes aluminum oxide (AlOx).

3. The semiconductor device of claim 1, wherein a thickness of the first blocking layer ranges from about 10 Å to about 1000 Å.

4. The semiconductor device of claim 1, wherein the first blocking layer is spaced apart from the first upper contact.

5. The semiconductor device of claim 1, wherein the first upper interlayer insulating layer includes a protrusion protruding toward the first upper interconnection line.

6. The semiconductor device of claim 5, wherein the first blocking layer comprises: a first portion extending in a direction parallel to a bottom surface of the 10 first upper interconnection line; and a second portion extending along a sidewall of the protrusion.

7. The semiconductor device of claim 1, further comprising:
 an interface layer provided under the first upper interlayer insulating layer;
 a low-k dielectric layer provided under the interface layer; and
 a second blocking layer disposed between the interface layer and the low-k dielectric layer,
 wherein the second blocking layer is in contact with the low-k dielectric layer.

8. The semiconductor device of claim 7, wherein the second blocking layer is spaced apart from the first upper contact.

9. The semiconductor device of claim 1, further comprising:
 a second upper contact electrically connected to the capacitors, the second 25 upper contact penetrating the first upper interlayer insulating layer; and
 a second upper interconnection line provided on the first upper interlayer insulating layer and electrically connected to the second upper contact,
 wherein the first blocking layer is absent between the second upper interconnection line and the first upper interlayer insulating layer.

10. The semiconductor device of claim 1, further comprising:
 a passivation layer provided on the second upper interlayer insulating layer,
 wherein the second upper interlayer insulating layer includes an extension protruding in a direction toward the passivation layer, and
 wherein the extension vertically overlaps with the first upper interconnection line.

11. A semiconductor device comprising:
 a substrate including a cell array region and a peripheral circuit region;
 capacitors provided on the cell array region of the substrate;
 peripheral transistors provided on the peripheral circuit region of the substrate;
 a first lower interconnection line connected to at least one of the peripheral transistors;
 a second lower interconnection line connected to the capacitors;
 an interface layer covering the first and second lower interconnection lines;
 a first upper interlayer insulating layer and a second upper interlayer insulating layer which are sequentially stacked on the interface layer;
 a first upper contact and a second upper contact which penetrate the first upper interlayer insulating layer and the interface layer so as to be electrically connected to the first and second lower interconnection lines, respectively;

a first upper interconnection line and a second upper interconnection line which are electrically connected to the first and second upper contacts, respectively, the second upper interlayer insulating layer covering the first and second upper interconnection lines; and
a first blocking layer disposed between the first upper interlayer insulating layer and the second upper interlayer insulating layer,
wherein the first blocking layer is spaced apart from the first upper contact, and
wherein the first upper interlayer insulating layer includes a protrusion protruding toward the first upper interconnection line.

12. The semiconductor device of claim 11, wherein the first blocking layer is absent between the first upper interconnection line and the first upper interlayer insulating layer and between the second upper interconnection line and the first upper interlayer insulating layer.

13. The semiconductor device of claim 11,
wherein the first blocking layer comprises: a first portion extending in a direction parallel to a bottom surface of the first upper interconnection line; and a second portion extending along a sidewall of the protrusion.

14. The semiconductor device of claim 11, wherein a hydrogen permeability of the first blocking layer is lower than a hydrogen permeability of the interface layer.

15. The semiconductor device of claim 11, further comprising:
a low-k dielectric layer provided under the interface layer; and
a second blocking layer disposed between the interface layer and the low-k dielectric layer,
wherein the second blocking layer is in contact with the low-k dielectric layer.

16. A semiconductor device comprising:
a substrate including a cell array region and a peripheral circuit region;
capacitors provided on the cell array region of the substrate, wherein each of the capacitors comprises a bottom electrode, a top electrode, and a dielectric layer between the bottom electrode and the top electrode;
peripheral transistors provided on the peripheral circuit region of the substrate;
a low-k dielectric layer provided on the capacitors and the peripheral transistors;
a first lower interconnection line electrically connected to at least one of the peripheral transistors, and a second lower interconnection line electrically connected to the capacitors, the first and second lower interconnection lines penetrating the low-k 15 dielectric layer;
an interface layer covering the first and second lower interconnection lines;
a first upper interlayer insulating layer provided on the interface layer;
a second upper interlayer insulating layer provided on the first upper interlayer insulating layer;
a blocking layer disposed between and to be in contact with the first upper interlayer insulating layer and the second upper interlayer insulating layer;
a first upper contact and a second upper contact which penetrate the first upper interlayer insulating layer and the interface layer so as to be connected to the first and second lower interconnection lines, respectively;
a first upper interconnection line and a second upper interconnection line which are electrically connected to the first upper contact and the second upper contact, respectively, the second upper interlayer insulating layer covering the first and second upper interconnection lines; and
a passivation layer on the second upper interlayer insulating layer,
wherein the blocking layer is absent between the first upper interconnection line and the first upper interlayer insulating layer and between the second upper interconnection line and the first upper interlayer insulating layer.

17. The semiconductor device of claim 16, wherein the first upper interlayer insulating layer includes a protrusion protruding toward the first upper interconnection line,
wherein the blocking layer comprises: a first portion extending in a direction parallel to a bottom surface of the first upper interconnection line; and a second portion 15 extending along a sidewall of the protrusion.

18. The semiconductor device of claim 16, wherein the blocking layer is spaced apart from the first upper contact and the second upper contact.

19. The semiconductor device of claim 16, wherein an upper width of each of the first and second upper interconnection lines is less than a lower width of each of the first and second upper interconnection lines.

20. The semiconductor device of claim 16, wherein a thickness of the blocking layer ranges from about 10 Å to about 1000 Å.

* * * * *